United States Patent [19]
McDonald

[11] 3,708,731
[45] Jan. 2, 1973

[54] GALLIUM ARSENIDE INTEGRATED CIRCUIT

[75] Inventor: Bruce A. McDonald, Stamford, Conn.

[73] Assignee: Unisem Corporation, Trevose, Pa.

[22] Filed: Feb. 24, 1970

[21] Appl. No.: 17,001

Related U.S. Application Data

[62] Division of Ser. No. 657,703, Aug. 1, 1967, Pat. No. 3,541,678.

[52] U.S. Cl..........317/235 R, 317/235 B, 317/235 G, 317/235 AC

[51] Int. Cl...............................................H01l 11/14

[58] Field of Search.....317/235 G, 235 AC, 235 AT, 317/235 N

[56] References Cited

UNITED STATES PATENTS

| | | | |
|---|---|---|---|
| 3,354,007 | 11/1967 | Michelitseh | 317/235 |
| 3,476,593 | 11/1969 | Lehrer | 317/235 |
| 3,493,812 | 2/1970 | Weimer | 317/235 |

*Primary Examiner*—Jerry D. Craig
*Attorney*—Shenier and O'Connor

[57] ABSTRACT

A gallium arsenide integrated circuit and method of making the same in which a heat-resistant protective mask is formed over a gallium arsenide layer extending through a thin dielectric film diffusion opening into contact with a doped silicon substrate. This structure is heated to diffuse material upwardly from the substrate into the gallium arsenide layer. Following the diffusion, openings are formed in the mask and suitable contacts are applied to the resultant structure.

4 Claims, 9 Drawing Figures

PATENTED JAN 2 1973 3,708,731

INVENTOR.
BRUCE A. McDONALD
BY
Shenier & O'Connor
ATTORNEYS

GALLIUM ARSENIDE INTEGRATED CIRCUIT

This application is a division of my copending application Ser. No. 657,703, filed Aug. 1, 1967, now U.S. Pat. No. 3,541,678.

BACKGROUND OF THE INVENTION

Gallium arsenide combines advantageous characteristics which render it desirable for use in integrated circuits. These characteristics are high mobility of minority carriers and a large band gap. While this material has characteristics which make it desirable for use in forming integrated circuits, it has heretofore been difficult and costly to form integrated circuits incorporating gallium arsenide.

In the conventional techniques of forming an integrated circuit using a silicon substrate slice, for example, an oxide mask, the thickness of which can be accurately controlled, is thermally formed on the surface of the slice and suitable diffusion operations are performed through openings in the mask to form the desired junctions. While these techniques are suitable for use with a silicon wafer, they have heretofore proved so difficult for use with gallium arsenide as to make the process impracticable. A number of reasons for this result exist. First, gallium arsenide, unlike silicon, does not form an oxide which is capable of masking the gallium arsenide substrate against impurities. Owing to that fact, in order to provide a mask a highly non-porous pyrolytic oxide must be deposited on the substrate of single crystal gallium arsenide prior to diffusion. While a pyrolytic mask, deposited by sputtering, for example, forms an effective mask, its thickness cannot readily be controlled. As a result, in the formation of a device such as an insulated gate field-effect transistor in which dielectric thickness is relatively critical, extreme care must be exercised in depositing the mask.

Secondly, gallium arsenide is unable to withstand temperatures in excess of about 650°C. without sublimating, unless it is heated in a controlled arsenic atmosphere. Owing to this fact, if diffusions are to be performed on a masked gallium arsenide substrate, they must be performed in a sealed ampule. Obviously, such a procedure does not readily lend itself to mass production.

I have invented a gallium arsenide integrated circuit and method of making the same which overcomes the difficulties of the prior art outlined above. My method permits the formation of a gallium arsenide integrated circuit by use of many of the conventional steps of the prior art of forming silicon integrated circuits. It does not require a carefully controlled deposition of a pyrolytic oxide on a gallium arsenide substrate. It avoids the necessity for performing diffusions in a heated ampule. Critical oxide thickness required where a gate dielectric is employed is readily obtained in my process. I avoid such contamination of an active gate surface in subsequent process steps as might occur in methods of the prior art.

SUMMARY OF THE INVENTION

One object of my invention is to provide a gallium arsenide integrated circuit and method of making the same which overcomes the disadvantages of methods of the prior art of making gallium arsenide integrated circuits.

Another object of my invention is to avoid the necessity for careful deposition of a pyrolytic oxide diffusion mask on the surface of a gallium arsenide substrate prior to diffusing into that substrate.

A further object of my invention is to form a gallium arsenide integrated circuit without the necessity of performing diffusion operations in a sealed ampule.

Still another object of my invention is to avoid possible contamination of a previously formed gate surface in later process steps.

Other and further objects of my invention will appear from the following description.

In general my invention contemplates the provision of a gallium arsenide integrated circuit and method in which I deposit a protective mask over a gallium arsenide layer deposited on a silicon substrate carrying a thin thermally grown oxide mask of predetermined thickness provided with spaced openings over doped regions of the substrate. I heat the thus layered chip to diffuse material up through the film openings to form junctions between the silicon substrate and the gallium arsenide layer. Following that operation, suitable contacts are made through the protective oxide layer.

Brief Description of the Drawings

In the accompanying drawings which form part of the instant specification and which are to be read in conjunction therewith and in which like reference numerals are used to indicate like parts in the various views.

Description of the Preferred Embodiment

Figures 1, 2, 3, 4, 5, 6, 7, 8:
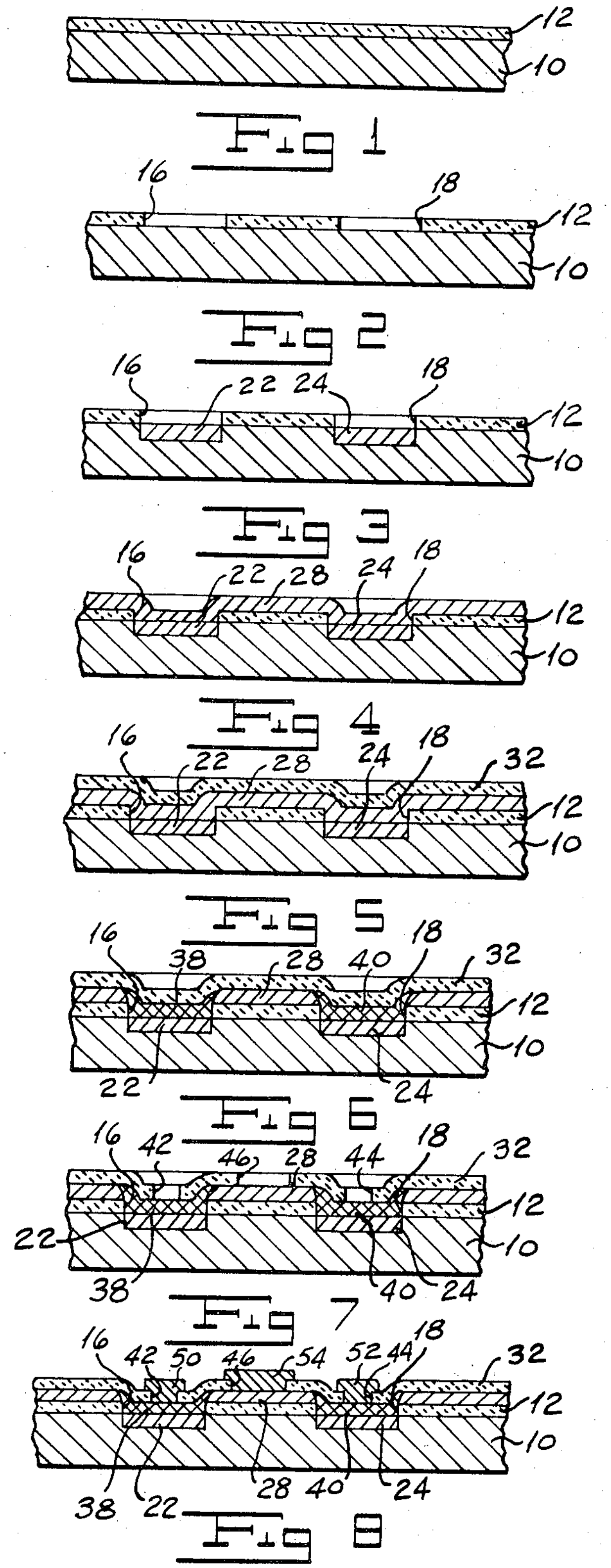
FIG. 1 is a fragmentary sectional view of a silicon substrate carrying a thin oxide film on one surface thereof.
FIG. 2 is a fragmentary sectional view similar to FIG. 1 illustrating the formation of diffusion openings in the thin film.
FIG. 3 is a fragmentary sectional view similar to FIG. 2 showing the condition of the chip following diffusion through the film openings.
FIG. 4 is a fragmentary sectional view similar to FIG. 3 showing the chip following application of a layer of gallium arsenide thereto.
FIG. 5 is a fragmentary sectional view similar to FIG. 4 showing the chip after formation of a protective oxide layer on the surface thereof.
FIG. 6 is a fragmentary sectional view similar to FIG. 5 showing the condition of the chip following heating thereof to form diffused junctions.
FIG. 7 is a fragmentary sectional view similar to FIG. 6 illustrating the condition of the chip after formation of contact openings in the protective oxide layer.
FIG. 8 is a fragmentary sectional view similar to FIG. 7 showing the condition of the chip after the application of contacts thereto.

Referring now to the drawings, I start with a chip substrate 10 which may, for example, be p-type silicon material having a thickness of about 0.2 cm. I form a thin oxide layer or film 12 on the surface of the chip 10 by subjecting the chip to heat in an oxidizing atmosphere. As is known in the prior art, the thickness of the film 12 formed on the substrate 10 can be closely controlled. This is in contrast to a pyrolytic film deposited by sputtering for example. In making my integrated circuit which, as will be apparent from the following description, is a field-effect transistor, the thickness of film 12 is relatively critical and I form it to have a thickness of about 1,500 A. The step of forming the film 12 is indicated by the block 14 in FIG. 9.

After having formed film 12 I next provide the film with spaced diffusion openings 16 and 18 by use of silicon wafer techniques known in the prior art. For example, I may apply photographic resist to the film 12 in liquid form as by dipping or the like. This resist, upon drying, forms a thin plastic film, photographically sensitive to ultraviolet light. When the film has dried I expose it to ultraviolet light through a suitable mask. The unexposed areas of the mask are soluble in the developer and are removed. The wafer is then placed in a suitable etchant such, for example, as a hydrofluoric acid bath to remove the oxide in the region of the openings 16 and 18 wherein it is not protected by the resist. The acid bath will attack only the silicon oxide and not the underlying silicon or the developed photoresist. These operations required to form openings 16 and 18 are indicated by the block 20 in FIG. 9.

Having formed the openings 16 and 18, I next diffuse a suitable dopant into the substrate 10 through openings 16 and 18 to form n+ regions 22 and 24 in the substrate. This diffusion operation may be performed in any suitable manner known to the art. For example, the substrate 10 may be heated to a temperature of about 1,200°C. in the presence of a suitable impurity gas such, for example, as phosphorus pentoxide. It will readily be appreciated of course that any suitable impurity may be used. Selection of the diffusant will depend upon what penetration and surface concentration of impurity atoms is desired. As is known, the depth of penetration of the diffusant may accurately be controlled. Since the diffusing step per se does not make up my invention, it will not be described in greater detail. The step is indicated by the block 26 in FIG. 9.

Figure 9:
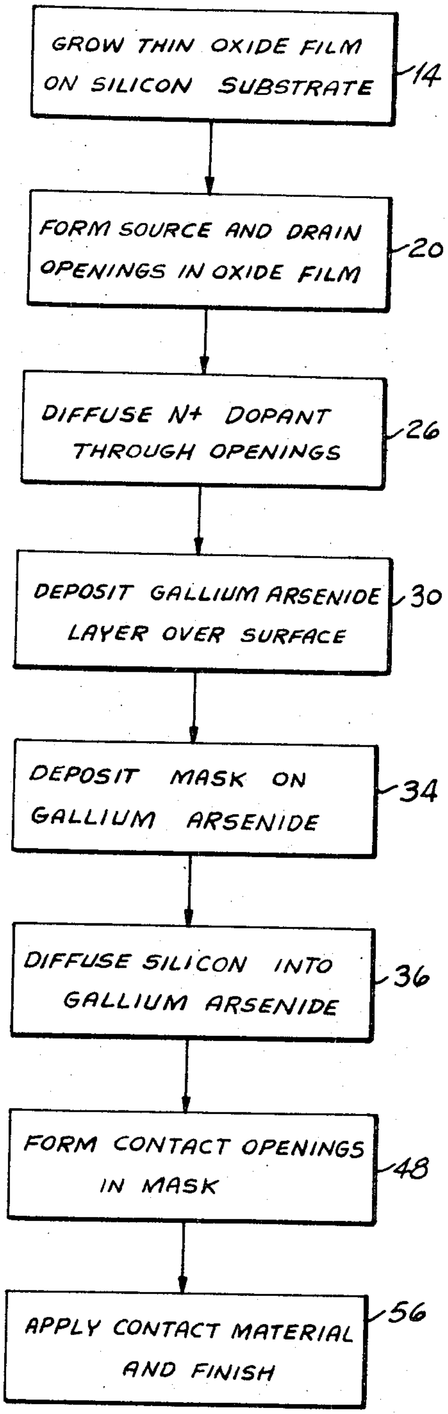
FIG. 9 is a block diagram illustrating the steps in the formation of my gallium arsenide integrated circuit formed by my method.

Having formed the doped regions 22 and 24 in the substrate 10, I next apply a layer 28 of p-type gallium arsenide to the surface of the chip 10 so as to cover the openings 16 and 18 and to extend over the area of the film 12 outside the openings. This step, which is indicated in FIG. 9 by the reference character 30, may be achieved in any suitable manner such, for example, as by growing the gallium arsenide on the chip from the vapor phase. Alternatively, the gallium arsenide might be sputtered onto the surface of the substrate 10. The optimum thickness for the layer 28 can be empirically determined but should not exceed a reasonable diffusion depth for silicon into gallium arsenide.

When the gallium arsenide layer 28 has been formed on the surface of the chip 10, I next deposit a protective mask 32 of oxide over the surface of the layer 28. This protective mask may be either silicon dioxide or silicon nitride sputtered onto the surface. I have successfully used pyrolytic silicon dioxide with gallium arsenide. The step of applying the protective oxide is indicated in FIG. 9 by the block 34. It will readily be appreciated that the thickness of this layer 32 is not critical. All that is necessary is that it completely cover the gallium arsenide layer 28 so as to prevent it from sublimating when the diffusing step, to be described, is performed.

When the protective oxide coating 32 has been formed on the chip, the chip is subjected to a temperature sufficiently high to cause diffusion from the regions 22 and 24 into the regions 38 and 40 of the gallium arsenide within the openings 16 and 18 to form junctions in these regions. This step, which is indicated by the block 36 in FIG. 9, may be performed at any suitable temperature such, for example, as 900° or 1,000°C. It is to be noted that the protective oxide layer 32 prevents sublimation of the gallium arsenide layer 28 so that the step need not be performed in a controlled atmosphere. Layer 32 also protects the portion of layer 28 between the openings 16 and 18.

After the diffusion step is complete, I form suitable contact openings in the protective mask 32 as indicated by block 48. These contact openings may be formed in a manner analogous to that described hereinabove in connection with the formation of openings 16 and 18. When forming the insulated gate field-effect transistor shown in the drawings, I provide a source contact opening 42, a drain contact opening 44 and a contact opening 46 in the region of the layer 28 between regions 38 and 40. Having formed the openings, I metallize the chip to provide contacts 50, 52 and 54 extending through the openings 42, 44 and 46 and perform the necessary finishing operations as indicated by block 56.

The operation of the device resulting from my method is precisely analogous to that of a standard insulated gate field-effect transistor with the exception that the inversion of the gallium arsenide layer 28 takes place at the lower surface as viewed in FIG. 8 rather than at the upper surface. That is, the contact 54 which normally would be considered a gate contact now serves as a "substrate" contact while the silicon substrate 10 forms the gate electrode of the device. This will be appreciated from the fact that we have two superposed insulated gate field-effect transistors. In other words, as has just been explained, application of a gate potential to the substrate 10 will result in control of conduction through the region of the layer 28 between the two junctions in regions 38 and 40. In this instance, contact 54 acts as a substrate contact. This is the normal operation of the device. On the other hand, if terminal 54 were used as a gate contact and the silicon wafer 10 were kept at a constant potential, then change in the gate potential would control conduction through the silicon in the region of its interface with the thin oxide film 12 between the junctions in regions 38 and 40.

A reverse bias on either the source region 38 or the drain region 40 of the gallium arsenide results in a reverse bias of the silicon regions since the junctions exist there also. Thus, isolation is assured for each of the metal-oxide-gallium arsenide transistors (with gating potential applied to the silicon 10) just as it is for each underlying metal-oxide-silicon transistor (with region 28 the gating electrode). In the actual operation of the circuit, however, the gating potential is applied to the silicon 10 and contact 54 is a "substrate" contact so that the metal-oxide-silicon transistor is substantially non-functional since enhancement of the metal-oxide-gallium arsenide devices results in the depletion of the metal-oxide-silicon devices. This result follows from the polarity of the voltages on the respective "substrates."

By way of summary, in practice of my method of making a silicon base gallium arsenide integrated circuit, I first thermally grow the film 12 on the wafer 10 so as to provide the required critical thickness of gate insulation necessary in the completed device. As is known in the art, this critical control can readily be achieved by subjecting a silicon wafer to heat in an oxidizing atmosphere for a certain period of time. Next I form the spaced source and drain openings 16 and 18 in the film 12 by use of the well-known photoresist process. Having formed the openings 16 and 18, I diffuse a suitable n+ dopant, such as phosphorus pentoxide, into the silicon wafer 10 to provide n+ doped regions 22 and 24. When the regions 22 and 24 have been formed I apply a layer 28 of gallium arsenide over the surface of the wafer as by growing the layer from the vapor phase. The material is p-type material. The thickness of the layer cannot exceed a reasonable diffusion depth for silicon into gallium arsenide.

Following application of the gallium arsenide layer I apply a protective mask 32 over the surface of the wafer. Owing to the fact that gallium arsenide will not readily form an oxide, I produce the oxide film 32 by sputtering either silicon dioxide or silicon nitride or the like over the surface of the wafer. Since the thickness of this layer is not critical, sputtering is an entirely satisfactory method for producing the coating. I next subject the wafer to a temperature sufficient to diffuse material from the regions 22 and 24 up into the layer 28 to form n-type regions 38 and 40 forming junctions with the material of the wafer 10. This operation is carried on for a length of time sufficient to complete the diffusion. Owing to the fact that the gallium arsenide 28 is completely protected by the oxide coating 32, it cannot sublimate at the temperature of around 900°C. required for the diffusion.

Upon completion of the diffusion operation, I provide contact openings as required. Subsequently, contact material is applied and finishing operations, such as sintering, are performed. The resultant device is a highly effective, insulated gate field-effect transistor wherein the wafer 10 acts as the gate electrode.

It will be seen that I have accomplished the objects of my invention. I have provided a gallium arsenide integrated circuit which can be produced in an expeditious and economical manner. I have provided a method of making a gallium arsenide integrated circuit which overcomes the defects of methods of the prior art. My method does not require careful application of a critically thick pyrolytic oxide mask on a gallium arsenide wafer. My method permits the performance of diffusion operations without the necessity of controlling the atmosphere in which the operations are performed.

It will be understood that certain features and subcombinations are of utility and may be employed without reference to other features and subcombinations. This is contemplated by and is within the scope of my claims. It is further obvious that various changes may be made in details within the scope of my claims without departing from the spirit of my invention. It is, therefore, to be understood that my invention is not to be limited to the specific details shown and described.

Having thus described my invention, what I claim is:

1. A semiconductor device including in combination, a substrate of silicon semiconductor material of one conductivity type, said substrate having a surface, a thin film of dielectric material on said surface, a pair of spaced openings in said dielectric film, respective regions of material of the opposite conductivity type in said substrate below said openings, and a layer of gallium arsenide of said one conductivity type over said openings and over said film between said openings, material of said regions being diffused into the portions of said gallium arsenide layer over said openings.

2. A semiconductor device as in claim 1 including means for applying a potential across the portions of said gallium arsenide over said openings.

3. A semiconductor device as in claim 2 including means for applying a potential to said gallium arsenide layer at a location between said openings.

4. A semiconductor device as in claim 1 including an insulating layer over said gallium arsenide layer, respective openings in said insulating layer over said film openings and a third opening in said insulating layer at a location between said openings and respective electrical contacts extending through said insulating layer openings.

* * * * *